United States Patent

Ni et al.

[11] Patent Number: 5,972,754
[45] Date of Patent: Oct. 26, 1999

[54] METHOD FOR FABRICATING MOSFET HAVING INCREASED EFFECTIVE GATE LENGTH

[75] Inventors: Cheng-Tsung Ni; Chih-Hsun Chu, both of Hsinchu, Taiwan

[73] Assignee: Mosel Vitelic, Inc., Taiwan

[21] Appl. No.: 09/095,674

[22] Filed: Jun. 10, 1998

[51] Int. Cl.⁶ .................................................. H01L 21/265
[52] U.S. Cl. ........................ 438/270; 438/297; 438/303
[58] Field of Search ..................................... 438/270, 303, 438/297

[56] References Cited

U.S. PATENT DOCUMENTS

| | | | |
|---|---|---|---|
| 5,160,491 | 11/1992 | Mori | 438/270 |
| 5,362,665 | 11/1994 | Lu | 438/270 |
| 5,371,024 | 12/1994 | Hieda et al. | 438/270 |
| 5,587,340 | 12/1996 | Yamazaki | 438/270 |
| 5,672,524 | 9/1997 | Liu et al. | 438/270 |

FOREIGN PATENT DOCUMENTS 55-157242  12/1980  Japan .
61-287151  12/1986  Japan .

*Primary Examiner*—Charles Bowers
*Assistant Examiner*—David S Blum
*Attorney, Agent, or Firm*—Coudert Brothers

[57] ABSTRACT

A process for fabricating a semiconductor device comprising a source, a drain, and a gate electrode having an increased effective gate length. A semiconductor device is fabricated by a process comprising the following steps: forming active areas separated by field oxide regions; forming a lightly doped region in each active area; forming a heavily doped p-Si (or a-Si) layer; depositing and patterning several dielectric layers to form a gate area surrounded by vertical spacers; forming a groove in the gate area and the substrate; forming a gate oxide layer in the groove and driving dopants in the doped p-Si (or a-Si) layer into the substrate to form the source and the drain; and forming a gate electrode in the groove.

13 Claims, 6 Drawing Sheets

METHOD FOR FABRICATING MOSFET HAVING INCREASED EFFECTIVE GATE LENGTH

BACKGROUND OF THE INVENTION

1. Field of the Invention

This invention relates generally to processes for fabricating semiconductor devices having gate electrodes, and in particular to a new process for fabricating a deep-submicron metal-oxide semiconductor field effect transistor (MOSFET) with a gate having an increased effective gate length.

2. Description of the Prior Art

A Under conventional MOS manufacturing processes, transistors must be separated from each other to prevent operational interference and short circuits between them. This isolation is typically accomplished by providing a field oxide (FOX) region between transistors. A typical manufacturing process for making this field oxide region is the local oxidation of silicon (LOCOS) process. In this process, comparatively thick oxide layers, partly or wholly inset in the silicon substrate, may be obtained through the use of an oxidation-resistant silicon-nitride-containing masking layer.

As shown in the cross-section taken through a partial perspective view of a semiconductor device shown in FIG. 1A, an active area 12 is defined by a circumscribing field oxide region 10 after fabrication using the LOCOS process. A gate oxide layer 16, a polysilicon layer 18, and a phosphosilicate glass (PSG) layer 20 are sequentially deposited on top of the substrate 14 and the field oxide region 10.

Next, as sown in FIG. 1B, these layers are photolithographically patterned using well-known techniques not illustrated herein to define the gate structure 22 of what is to be a MOSFET device. The structure is subsequently subjected to a low-concentration $N^-/P^-$ ion implantation process as suggested by the arrows 24. The structure is then heated in a thermal diffusion furnace and, as a result of heating and annealing, the implanted ions form lightly doped source and drain regions 26 and 28, respectively. Care is taken to insure that the concentrations of the implanted ions are sufficiently low to avoid the hot electron effect and the short channel effect in the lightly doped regions.

Next, as shown in FIG. 1C, a silicon nitride ($Si_3N_4$) layer 30 is deposited on the structure and thereafter etched using an anisotropic etching process to form a vertically extending barrier 32 circumscribing the gate structure 22; see FIG. 1D. As illustrated in FIG. 1E, after the barrier 32 is formed, the remaining PSG layer 20 is selectively removed by the application of hydrofluoric acid (HF). Next, the structure is subjected to a high-concentration $N^+/P^+$ ion implantation process as indicated by the arrows 34, and the device is again heated in a thermal diffusion furnace at approximately 900 to 1000° C. to drive the implanted ions into the substrate 14 through the original source and drain regions 26 and 28 to form a heavily doped source 36 and a heavily doped drain 38. Note, however, that the $N^-$ regions beneath the barrier 32 survive as indicated at 26' and 28'. Meanwhile, the crystal structure of the surface regions of the silicon substrate damaged by the ion implantation process is restored through an annealing process.

Finally, as shown in FIG. 1F, a silicide layer 40 (e.g., a titanium silicide ($TiSi_x$) layer), which covers the gate 18, the source 36 and the drain 38, is formed through vacuum deposition and rapid thermal nitridation (RTN) processes, thus completing the MOS manufacturing process.

Under the aforesaid conventional MOS manufacturing process, it is very difficult to generate a gate length of very fine dimensions. As known to those skilled in the art, the gate structure 22 in FIGS. 1B–1F is defined by a photoresist pattern of an equal length. As the critical dimensions of the semiconductor process technology become smaller and smaller, it becomes more and more difficult to build a photoresist pattern that would not easily peel off from the substrate during processing. This difficulty, if not resolved, would significantly limit the future development of deep sub-micron (e.g., quarter-micron or less) semiconductor structures.

Moreover, the aforesaid conventional technology utilizes ion implantation and thermal diffusion process to drive high-concentration ions into the substrate to form the source and drain. Because it is difficult to control the depth of implantation and diffusion, the ions may be diffused too deeply into the sub-micron MOS device, causing irreversible device defects and savaging the entire MOS manufacturing process.

Another significant disadvantage of the aforesaid conventional MOS manufacturing process is that it entails a difficult alignment task for the subsequent interconnection process because of the very narrow source-to-drain contact region.

SUMMARY OF THE INVENTION

Accordingly, it is an object of the present invention to provide a new metal-oxide semiconductor (MOS) processing method that effectively increases the gate length of the MOS device.

Another object of the present invention is to provide effective deep-submicron MOS devices having increased gate lengths compatible with deep-submicron processing constrains (e.g., critical dimensions are less than 0.25 $\mu$m).

Still another object of the present invention is to provide a MOS processing method that allows better alignment tolerances in the subsequent interconnecting processing step.

Yet another object of the present invention is to reduce the source and drain areas of the MOS device, which reduction in turn lowers the gate-to-source and gate-to-drain capacitances and minimizes hot electron injections in the gate. It is well known to those skilled in the art that such capacitances may adversely influence the operation of the MOSFET in general, and that gate regions overlapping the source/drain should be as small as possible.

A further object of the present invention is to provide a manufacturing process for a MOSFET that allows effective control of the density and depth of dopant distributions, thus avoiding over-diffusion of the implanted dopants into the substrate as entailed by the conventional MOSFET manufacturing process.

In accordance with the objects described above, the present invention provides a method of fabricating a MOSFET with an increased effective gate length, essentially including the following processing steps:

forming one or more field oxide regions on a substrate using an isolation process, which field oxide regions defines one or more active areas;

forming a lightly doped region in any one or more selected active areas of the substrate using an ion implantation step and a thermal diffusion step;

forming a heavily doped polysilicon (p-Si) or amorphous silicon (a-Si) layer over the lightly doped region of the substrate and the surrounding field oxide regions;

forming a first dielectric layer on the p-Si or a-Si layer;

defining a gate area by selectively etching away a portion of the first dielectric layer to expose portions of the doped p-Si or a-Si layer;

forming a second dielectric layer covering the remaining portion of the first dielectric layer and the exposed p-Si or a-Si layer;

forming a third dielectric layer on the second dielectric layer;

anisotropically etching the third dielectric layer and the second dielectric layer to form vertical spacers surrounding the gate area and to expose portions of said doped p-Si or a-Si layer;

etching the p-Si or a-Si layer and the underlying substrate in the gate area to form an exposed groove therein;

providing threshold-voltage adjustment and anti-punch-through passivation by implanting dopants into the exposed surface regions of the substrate;

heating the structure to form a gate oxide layer covering the exposed groove surface and a polyoxide layer at the groove-engaging edges of the p-Si or a-Si layer; meanwhile, forming a source and a drain using a drive-in step in which the dopants in the p-Si or a-Si layer are substantially driven into the substrate through thermal diffusion; and forming a gate electrode in the groove.

An advantage of the present invention is that it provides an increased effective gate length compared to that achievable using conventional processing techniques.

Another advantage of the present invention is that it provides a MOSFET structure having better tolerance for alignment during the subsequent interconnection process.

These and other objects, features and advantages of the present invention will no doubt become apparent to those skilled in the art after reading the following detailed description of the preferred embodiment which is illustrated in the several figures of the drawing.

IN THE DRAWINGS

DETAILED DESCRIPTION OF THE PREFERRED EMBODIMENTS

While the present invention may be embodied in many forms, details of a preferred embodiment are schematically shown in FIGS. 2A through 2J, with the understanding that the present disclosure is not intended to limit the invention to the embodiment illustrated.

Figure 1A:
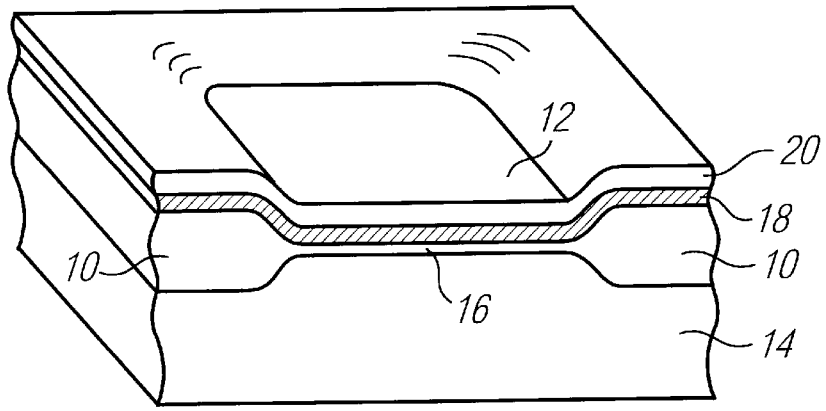
FIG. 1A is a partial perspective view of a prior-art MOSFET device.
Figure 1B:
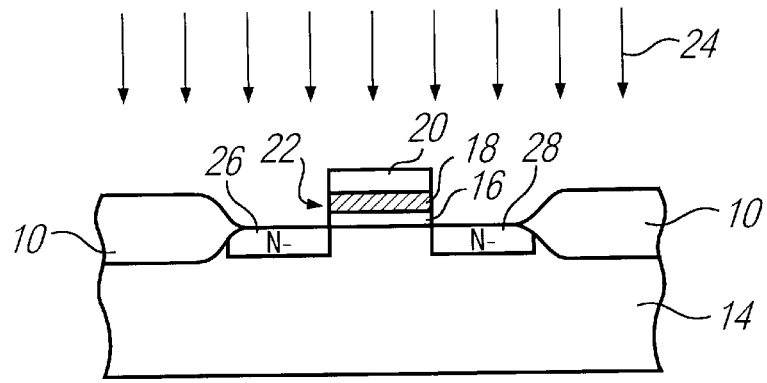
FIG. 1B is a schematic representation of a prior-art processing step for defining a gate area and forming lightly doped regions.
Figure 1C:
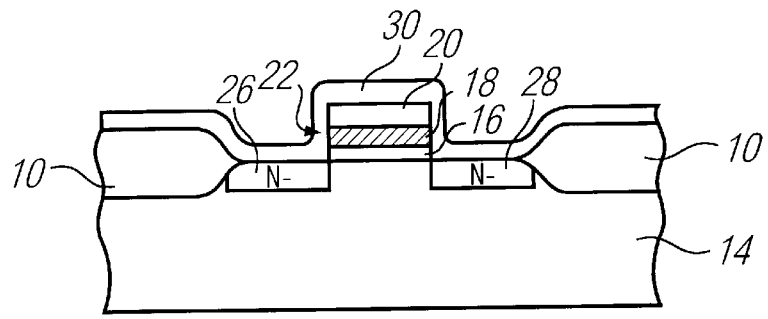
FIG. 1C is a schematic representation of the prior-art structure of FIG. 1B after formation of a silicon nitride layer.
Figure 1D:
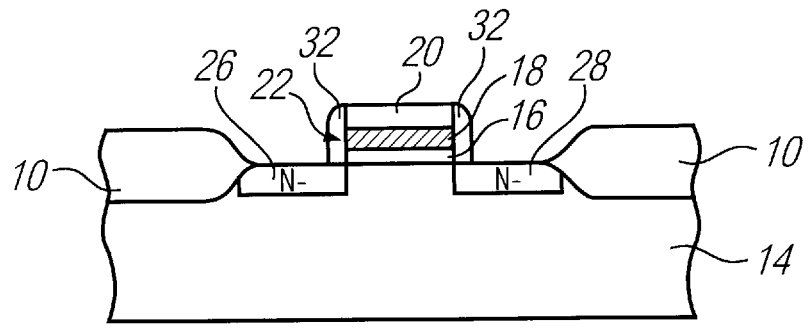
FIG. 1D is a schematic representation of the prior-art structure of FIG. 1C after the silicon nitride layer is anisotropically etched to form a spacer.
Figure 1E:
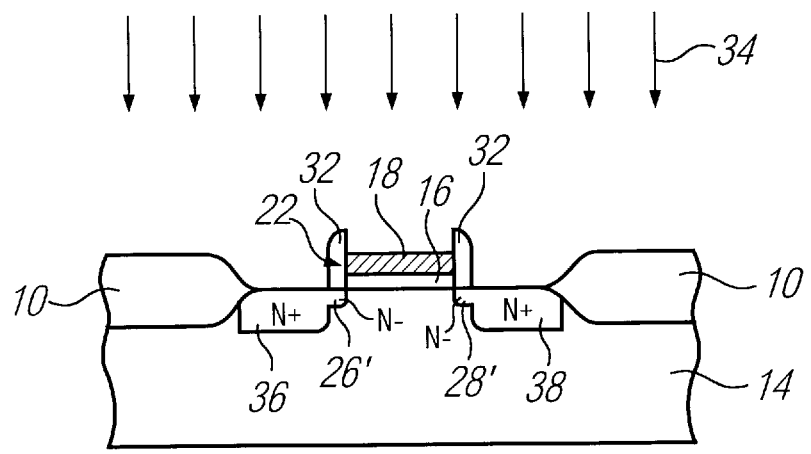
FIG. 1E is a schematic representation of a prior-art processing step for forming heavily doped source and drain in the substrate of FIG. 1D.
Figure 1F:
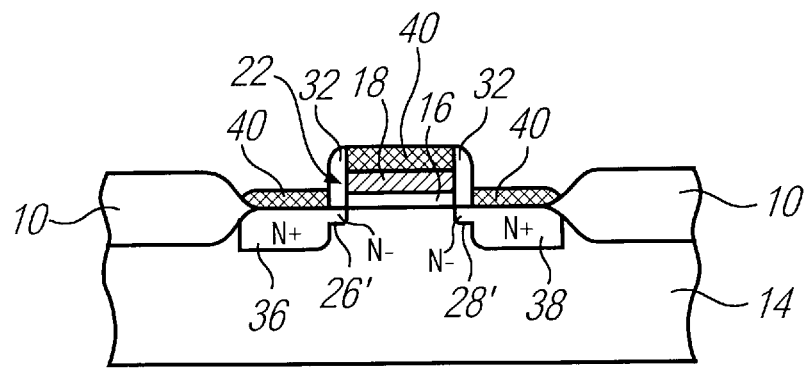
FIG. 1F is a schematic representation of the prior-art structure shown in FIG. 1E after selective deposition of a titanium silicide layer.
Figure 2A:
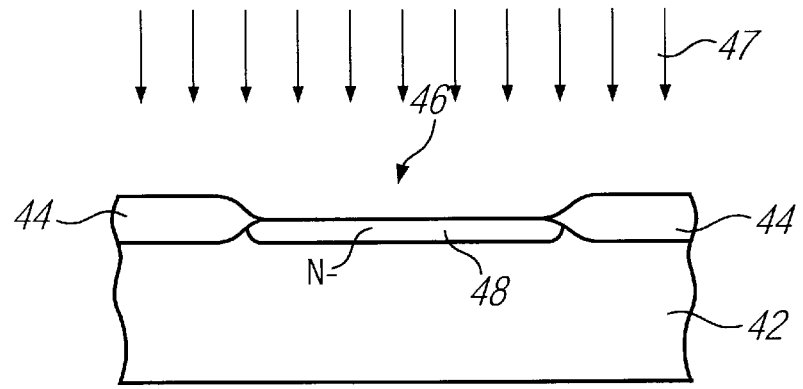
FIG. 2A is a schematic representation of a processing step of the present invention for forming a lightly doped, post-LOCOS (or STI) structure via ion-implantation and thermal diffusion processes.

In one specific embodiment of the present invention, selected portions of the surface of a substrate 42 are first oxidized to form field oxide regions 44 which define active areas 46 by electrically isolating such areas from the surrounding surface regions of the substrate. The illustrated field oxide region 44 is preferably formed by the local oxidation of silicon (LOCOS) process or the shallow trench isolation (STI) process, both of which are known to those skilled in the art. In FIG. 2A, low-concentration N⁻ or P⁻ ions 47 at concentrations of $1\times10^{12}$ to $1\times10^{14}/cm^2$ are implanted in the substrate 42 in the active area 46. The substrate is then placed in a thermal diffusion furnace at about 800 to 1100° C. to form a lightly doped region 48 near the surface of the substrate 42. Low-concentration N⁻ or P⁻ ions are used to avoid hot electron phenomenon caused by high local electric fields. Otherwise, hot electrons accelerated by high local electric fields may result in progressive device deterioration with an increase in the threshold voltage and a reduction in the transconductance. The lightly doped structure formed in accordance with the process described above can eliminate such adverse hot electron effects.

As a result of the above thermal treatment, a thin layer of silicon dioxide ($SiO_2$, not shown in the drawing) is formed on top of the lightly doped region 48 as well as the surrounding field oxide region 44. This silicon dioxide layer may be removed through an etching process as known to those skilled in the art.

Figure 2B:
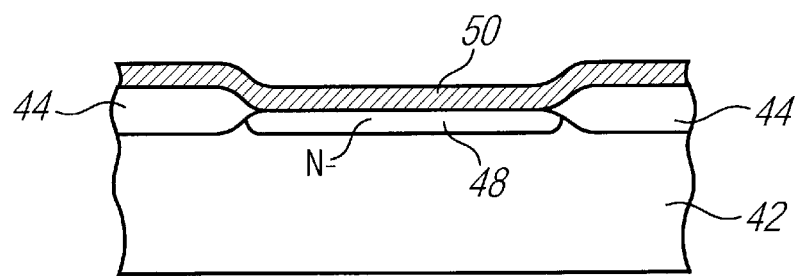
FIG. 2B is a schematic representation of the structure of the present invention after formation of a polysilicon layer or an amorphous silicon layer.

Next, as shown in FIG. 2B, a heavily doped polysilicon (p-Si) layer 50 having a thickness typically within the range between approximately 50 nm and 200 nm is formed on the lightly doped region 48 and the field oxide region 44. This heavily doped layer may be formed by a variety of processes, but is preferably formed by either depositing (typically through a low pressure chemical vapor deposition (LPCVD) process) a p-Si precursor (at typically $1\times10^{15}$ to $1\times10^{16}/cm^2$) in-situ-doped with high-concentration N⁺ or P⁺ impurities, or by first depositing a polysilicon layer (typically through an LPCVD process) and then implanting high-concentration N⁺ or P⁺ ions (at typically $1\times10^{15}$ to $1 \times 10^{16}/cm^2$) into the deposited polysilicon layer 50. The final dopant concentration is preferably $1 \times 10^{15}$ to $1 \times 10^{16}/cm^2$. Alternatively, instead of the p-Si layer, an amorphous silicon (a-Si) layer may be formed using an LPCVD process to serve the same purpose.

Figure 2C:
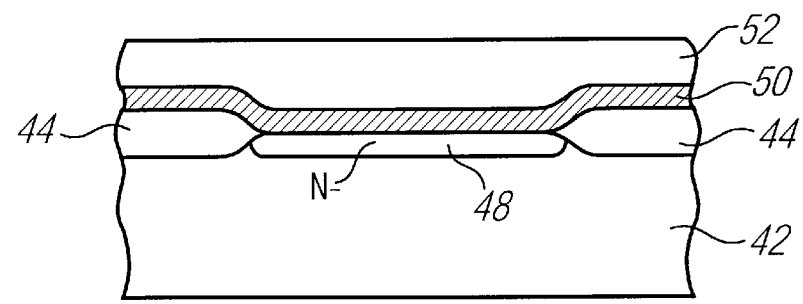
FIG. 2C is a schematic representation of the structure of the present invention after formation of a first dielectric layer.
Figure 2D:
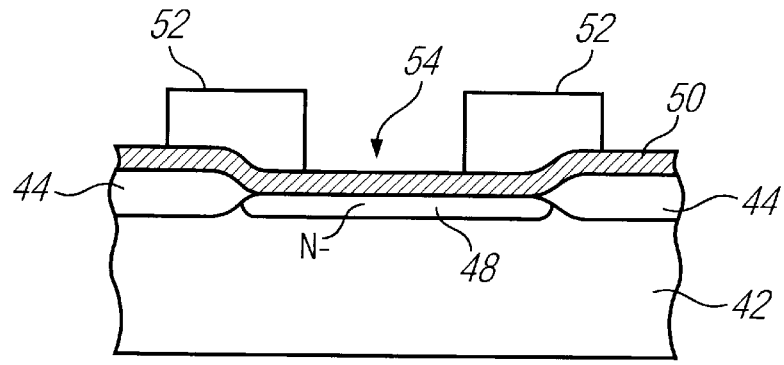
FIG. 2D is a schematic representation of the structure of the present invention after the first dielectric layer is etched to define a gate region.

Next, as shown in FIG. 2C, a first dielectric layer 52 is formed on the polysilicon layer 50. This first dielectric layer is approximately 100 to 300 nm thick and may be made of any of a variety of materials, preferably silicon dioxide ($SiO_2$) or silicon nitride ($Si_3N_4$), deposited through a chemical vapor deposition (CVD) process. The first dielectric layer 52 is then patterned using a photoresist layer as a mask. In this process, the surface of the first dielectric layer 52 is first coated with a resist layer (not shown). The layer is then exposed to an energy source, i.e. light, through a master pattern on a mask. The layer is then developed such that pre-defined portions of the developed layer are removed to reproduce a particular pattern on the first dielectric layer 52 which allows pre-defined portions of the first dielectric layer 52 to be etched away, thus forming a gate region 54 as shown in FIG. 2D and allowing the remaining first dielectric layer 52 to partially overlap both the lightly doped region 48 and the field oxide region 44". Preferably, etchants and etching conditions are carefully chosen to that the polysilicon material 50 is etched at a much slower rate. Thus, the polysilicon layer 50 functions as an etch stop for this gate formation process.

Figure 2E:
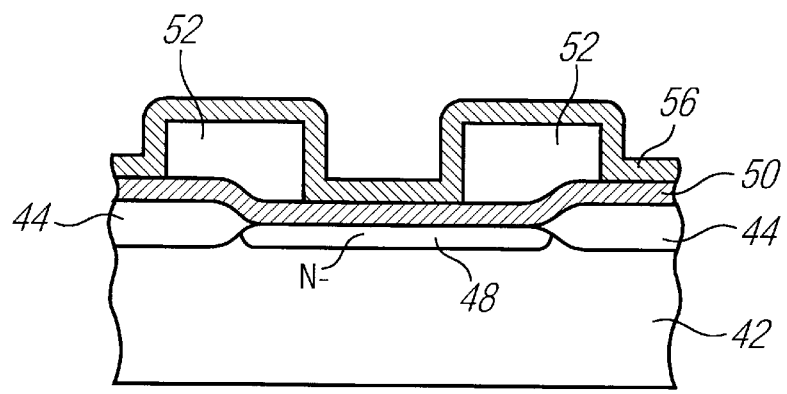
FIG. 2E is a schematic representation of the structure of the present invention after formation of a second dielectric layer.

Next, as shown in FIG. 2E, a second dielectric layer 56 is formed on the first dielectric layer 52 and the exposed portions of the polysilicon layer 50. The thickness of this second dielectric layer 56 may range from approximately 50 to 150 nm. This second dielectric layer may be made of any of any of a variety of materials, but is preferably formed by depositing either silicon dioxide ($SiO_2$) via a plasma enhanced chemical vapor deposition (PECVD) process or tetraethoxsilane ($Si(OC_2H_5)_4$) silicon dioxide (TEOS-$SiO_2$) via an LPCVD process. Such PECVD $SiO_2$ or LPCVD TEOS-$SiO_2$ layer typically provides for an effective step coverage.

Figure 2F:
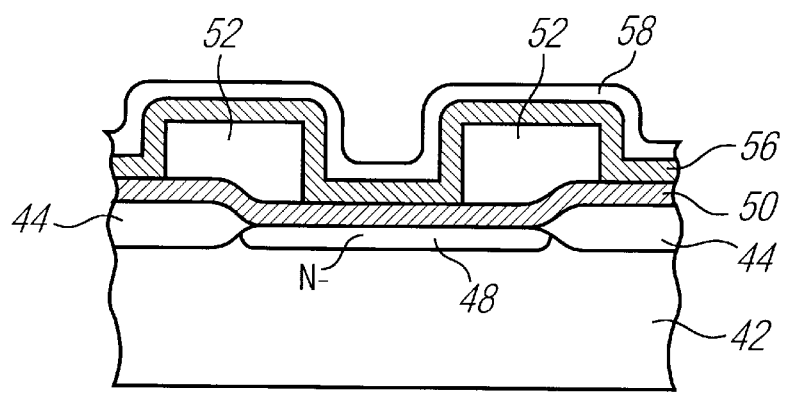
FIG. 2F is a schematic representation of the structure of the present invention of a third dielectric layer.

Next, a third dielectric layer 58 of approximately 50 to 150 nm thick is formed on top of the second dielectric layer 56, as shown in FIG. 2F. As discussed below, this third dielectric layer 58 will facilitate the formation of spacer regions via an anisotropic etching process. The third dielectric layer is preferably a CVD phosphosilicate glass (PSG) layer or a CVD borophosphosilicate glass (BPSG) layer. Either material, by virtue of its mobility, will result in a conforming layer providing adequate step coverage.

Preferably, the three dielectric layers 52, 56 and 58 are made of different materials, e.g., $Si_3N_4$/$SiO_2$/PBSG. These different layers will work as etch-stops as one is preferentially removed while the layer or layers under it remain essentially intact.

Figure 2G:
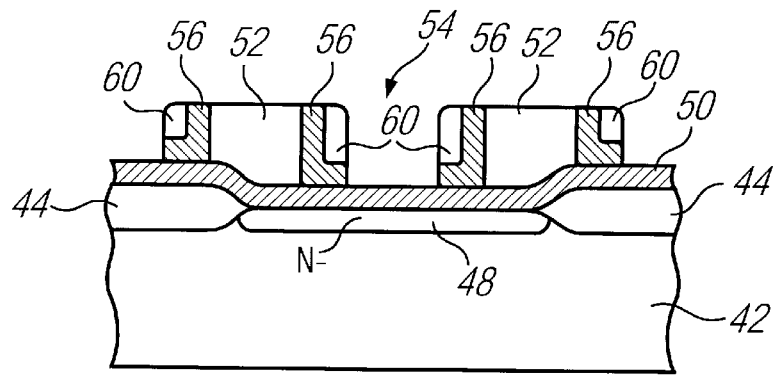
FIG. 2G is a schematic representation of the structure of the present invention after the third and the second dielectric layers are anisotropically etched to form a spacer.
Figure 2H:
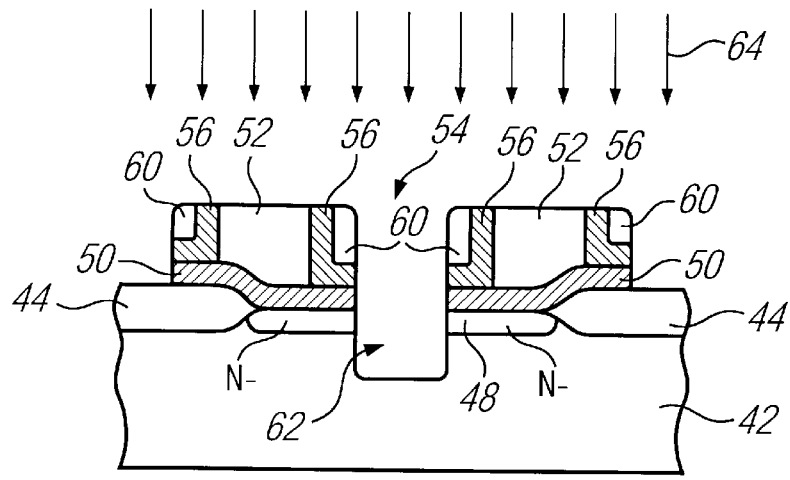
FIG. 2H is a schematic representation of the present processing step of etching the polysilicon layer and the substrate and implanting dopants for voltage adjustment and passivation.

FIG. 2G illustrates the next step of the present processing method. An anisotropic etching process is used to remove most of the third dielectric layer 58 and the second dielectric layer 56 to form vertically extending spacer regions 60 surrounding the gate region 54. The exposed polysilicon layer 50 and the substrate 42 at the gate area are then etched by either reactive-ion etching (RIE) or HF vapor to form an elongated groove 62; see FIG. 2H. Dopant ions 64 are then typically implanted into the surface regions of the entire exposed active area of the structure for transistor threshold-voltage adjustment and anti-punch-through passivation. The final concentration of the dopant ions is preferably $1 \times 10^{12}$ to $1 \times 10^{14}/cm^2$.

Figure 2I:
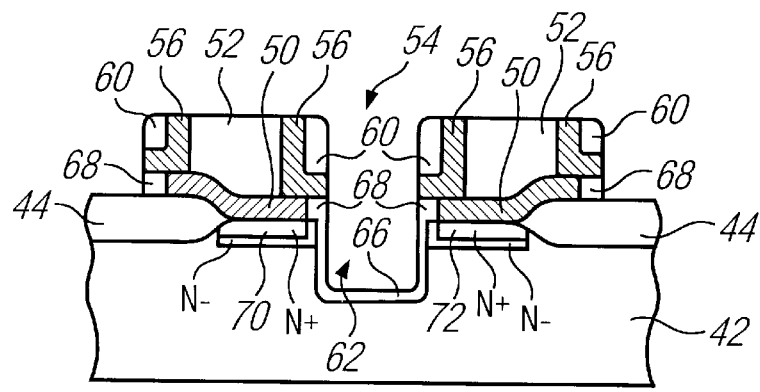
FIG. 2I is a schematic representation of the structure of the present invention after formation of a U-shaped gate oxide layer and source and drain regions.

Referring to FIG. 2I, a gate oxide layer 66 is formed in the interior surface of the groove by placing the entire structure in an oxidizing furnace (not shown). As shown in FIG. 2I, a polysilicon oxide ("polyoxide") layer 68 is also formed at portions of the polysilicon layer 50, including those portions engaging the groove 62, as a result of this thermal oxidation process. Meanwhile, through a thermally induced drive-in process, dopants in the heavily doped polysilicon layer 50 are substantially driven into the substrate 42, forming a source 70 and a drain 72.

Figure 2J:
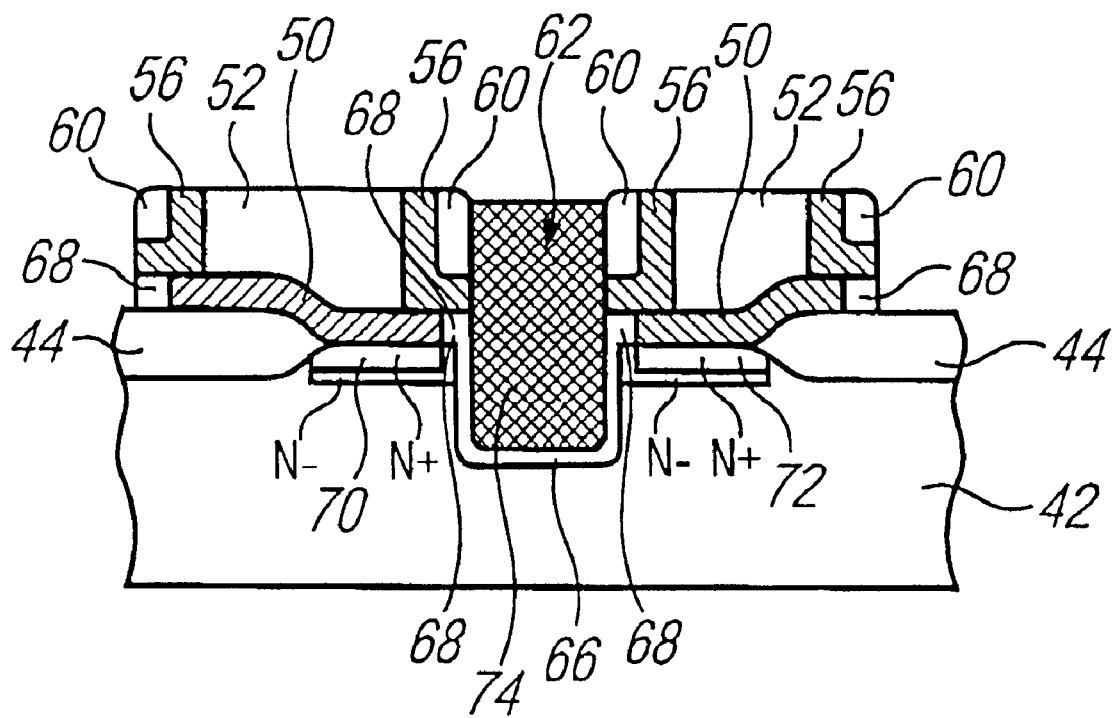
FIG. 2J is a schematic representation of the structure of the present invention after deposition of a gate electrode layer in the groove.

Finally, FIG. 2J depicts the formation of a gate electrode 74 in the groove 62. This gate electrode may be formed by any of a variety of processing techniques including CVD. The depth of the gate electrode, measured from the top of the exposed first dielectric layer 52, may range from approximately 100 nm to 300 nm. Although many different materials may be used for the gate electrode 74, the preferred materials are tungsten, heavily doped polysilicon (dopant concentration greater than $1 \times 10^{15}/cm^2$), or a conductive polycide comprising polysilicon and a metal silicide (e.g. titanium disilicide).

According to the above description, the gate oxide layer 66 of the present invention takes a generally "U" shape (in transverse cross-section) in the groove 62. This increases the effective gate length compared with what is generated by the conventional MOS manufacturing process. In fact, the effective gate length of the present invention can exceed the critical dimension of the processing technique, e.g. 0.25 $\mu$m for a typical deep-submicron process. By adjusting the depth relative to the width of the "U" shape, it is also possible to increase the effective source/drain contact area. In addition, the dielectric layers of the present invention are formed prior to the formation of the gate, and as a result provide better alignment tolerance in the subsequent process for manufacturing interconnections and help alleviate typical alignment problems associated with the conventional process.

Moreover, the source 70 and the drain 72 are formed by driving dopant ions imbedded in the heavily doped polysilicon layer 50 into the substrate 42 through a thermal diffusion process. Compared to conventional processes, the present process provides a uniform distribution of dopants in the substrate 42 by effectively controlling the depth and density of the penetrating dopant ions, thus avoiding the problem where the dopant ions are so deeply implanted into the substrate 42 that the function of the entire MOS structure is destroyed.

While the invention has been particularly shown and described with reference to the above preferred embodiment, it will be understood by those skilled in the art that many other modifications and variations may be made thereto without departing from the broader spirit and scope of the invention as set forth in the claims. The specification and drawings are accordingly to be regarded as an illustrative, rather than restrictive.

What is claimed is:

1. A process of fabricating on a substrate a semiconductor device having a source, a drain and a gate electrode, comprising the steps of:

forming a plurality of field oxide regions on said substrate to isolate a plurality of active areas;

forming a lightly doped region at one of said active areas;

forming a doped silicon layer including a type of dopants on said lightly doped region at said one active area and on the field oxide regions isolating said one active area;

forming a patterned first dielectric layer on said doped silicon layer to define a gate area, said patterned first dielectric layer partially overlapping both said lightly doped region and said isolating field oxide regions;

forming a second dielectric layer on said first dielectric layer and said doped silicon layer;

forming a third dielectric layer on said second dielectric layer;

anisotropically etching said third and second dielectric layers to form a plurality of spacer regions surrounding said gate area and to expose said doped silicon layer at said gate area;

forming a groove at said gate area by etching said exposed doped silicon layer and said substrate;

forming a gate oxide layer in said groove and forming said source and said drain in said substrate by substantially driving said dopants in said doped silicon layer into said substrate; and forming said gate electrode in said groove.

2. The process of claim 1, further comprising the step of implanting a second type of dopants into the exposed surface regions at said one active area between said step of groove formation and said step of gate oxide, source and drain formation, said second type of dopants at such a concentration as not to cause a short between said source and said drain after said step of gate oxide, source and drain formation.

3. The process of claim 1, wherein said doped silicon layer is a doped polysilicon layer.

4. The process of claim 1, wherein said doped silicon layer is a doped amorphous silicon layer.

5. The process of claim 3, wherein said doped silicon layer including dopants is formed by deposition of a polysilicon precursor in-situ-doped with said dopants.

6. The process of claim 3, wherein said doped silicon layer including dopants is formed by sequentially depositing a polysilicon layer and implanting said dopants into said polysilicon layer.

7. The process of claim 1, wherein said first dielectric layer is selected from the group consisting of a CVD silicon dioxide layer and a CVD silicon nitride layer.

8. The process of claim 1, wherein said second dielectric layer is selected from the group consisting of a PECVD silicon dioxide layer and an LPCVD TEOS-SiO$_2$ layer.

9. The process of claim 1, wherein said third dielectric layer is selected from the group consisting of a CVD phosphosilicate glass layer and a CVD borophosphosilicate glass layer.

10. The process of claim 1, wherein the concentration of said dopants in said doped silicon layer is between $1 \times 10^{15}$ and $1 \times 10^{16}/cm^2$.

11. The process of claim 1, wherein said gate electrode is made of a material selected from the group consisting of tungsten, heavily doped silicon and conductive polycide.

12. The process of claim 11, wherein said conductive polycide comprises polysilicon and titanium disilicide.

13. The process of claim 2, wherein said concentration of said second type of dopants is between $1 \times 10^{12}$ and $1 \times 10^{14}/cm^2$.

* * * * *